US012591172B2

(12) United States Patent (10) Patent No.: US 12,591,172 B2

Kashiwaya et al. (45) Date of Patent: Mar. 31, 2026

(54) EUV TRANSMISSIVE MEMBRANE

(71) Applicant: NGK INSULATORS, LTD.,
Nagoya-City (JP)

(72) Inventors: Toshikatsu Kashiwaya, Inazawa-City
(JP); Atsuo Kondo, Komaki-City (JP);
Hiroki Chaen, Yokohama-City (JP);
Takashi Tanimura, Handa-City (JP)

(73) Assignee: NGK INSULATORS, LTD., Nagoya
(JP)

( * ) Notice: Subject to any disclaimer, the term of this
patent is extended or adjusted under 35
U.S.C. 154(b) by 523 days.

(21) Appl. No.: 18/173,955

(22) Filed: Feb. 24, 2023

(65) Prior Publication Data

US 2023/0213848 A1 Jul. 6, 2023

Related U.S. Application Data

(63) Continuation of application No. PCT/JP2021/038811,
filed on Oct. 20, 2021.

(51) Int. Cl.
 G03F 1/22 (2012.01)
 G02B 1/14 (2015.01)

(52) U.S. Cl.
 CPC ....... G03F 1/22 (2013.01); G02B 1/14 (2015.01)

(58) Field of Classification Search
 CPC ................ G03F 1/22; G03F 1/62; G02B 1/14
 See application file for complete search history.

(56) References Cited

U.S. PATENT DOCUMENTS

| | | | |
|---|---|---|---|
| 10,228,615 B2 | 3/2019 | Nikipelov et al. | |
| 10,712,659 B2 | 7/2020 | Gallagher et al. | |
| 2001/0021239 A1 | 9/2001 | Itoga et al. | |
| 2009/0274962 A1 | 11/2009 | Kubota et al. | |
| 2017/0205704 A1* | 7/2017 | Nikipelov | G03F 7/70958 |
| 2018/0259845 A1 | 9/2018 | Nam et al. | |
| 2018/0348626 A1* | 12/2018 | Ahn | G03F 1/62 |
| 2024/0094628 A1* | 3/2024 | Kashiwaya | G03F 1/62 |

FOREIGN PATENT DOCUMENTS

| | | |
|---|---|---|
| EP | 2 927 746 B1 | 9/2021 |
| JP | H01-162332 A | 6/1989 |
| JP | H10-340843 A | 12/1998 |
| JP | 2000-338299 A | 12/2000 |
| JP | 2001-221689 A | 8/2001 |
| JP | 2009-271262 A | 11/2009 |
| JP | 2017-522590 A | 8/2017 |
| JP | 2018-151622 A | 9/2018 |
| JP | 2018-194840 A | 12/2018 |

(Continued)

OTHER PUBLICATIONS

Extended European Search Report dated May 13, 2025 (Application
No. 22883267.1).

(Continued)

*Primary Examiner* — Stewart A Fraser
(74) *Attorney, Agent, or Firm* — BURR PATENT LAW,
PLLC

(57) ABSTRACT

Provided is an EUV transmissive membrane including a
main layer composed of metallic beryllium and a protective
layer composed of beryllium nitride that covers at least one
side of the main layer.

7 Claims, 3 Drawing Sheets

(56) References Cited

FOREIGN PATENT DOCUMENTS

| | | | |
|---|---|---|---|
| JP | 6858817 | B2 | 4/2021 |
| WO | 2020/078721 | A1 | 4/2020 |

OTHER PUBLICATIONS

De La Cruz et al., "*Beryllium Nitride: An Alternative Material to Beryllium for Extreme Ultraviolet and Soft X-ray Uses*," Optical Materials, Elsevier Science Publishers B.V. Amsterdam, NL, vol. 25, No. 1, Feb. 1, 2004 (Feb. 1, 2004).
Extended European Search Report dated Apr. 4, 2024 (Application No. 21954413.7).
International Search Report and Written Opinion (Application No. PCT/JP2021/038811) dated Dec. 21, 2021.
International Search Report and Written Opinion (Application No. PCT/JP2022/034590) dated Dec. 6, 2022.
U.S. Appl. No. 18/310,609, filed May 2, 2023, Kashiwaya, Toshikatsu.
English translation of the Written Opinion dated Dec. 21, 2021 (Application No. PCT/JP2021/038811).
English translation of the Written Opinion dated Dec. 6, 2022 (Application No. PCT/JP2022/034590).

* cited by examiner

10

14

12

14

EUV TRANSMISSIVE MEMBRANE

CROSS-REFERENCE TO RELATED APPLICATION

This application is a continuation application of PCT/JP2021/038811 filed Oct. 20, 2021, the entire contents all of which are incorporated herein by reference.

BACKGROUND OF THE INVENTION

1. Field of the Invention

The present invention relates to an EUV transmissive membrane.

2. Description of the Related Art

With miniaturization in semiconductor manufacturing process advancing year by year, various improvements have been made in each step. Particularly, in a photolithography step, extreme ultraviolet (EUV) light having a wavelength of 13.5 nm has begun to be used in place of conventional ArF exposure having a wavelength of 193 nm. As a result, the wavelength was reduced to $\frac{1}{10}$ or less at once, and optical properties thereof were completely different. Since there is no material having a high transmittance to EUV light, however, there is still no practical pellicle, which serves as a particle adhesion-preventing membrane of, for example, a photomask (reticle). For this reason, device manufacturers currently cannot use pellicles when manufacturing semiconductor devices.

Therefore, a poly-Si based pellicle membrane has been proposed. For example, Patent Literature 1 (JP6858817B) discloses a pellicle membrane including a core layer that contains a material substantially transparent for EUV radiation such as (poly-)Si and a cap layer that contains a material absorbing IR radiation. However, the poly-Si based pellicle membrane is not yet practical because the EUV transmittance cannot reach the target value of 90% in a case where the thickness is set to maintain the membrane strength.

A carbon nanotube (CNT)-based pellicle membrane has also been developed (e.g., Patent Literature 2 (JP2018-194840A)), which is expected to have higher EUV transmittance.

CITATION LIST

Patent Literature

Patent Literature 1: JP6858817B
Patent Literature 2: JP2018-194840A

SUMMARY OF THE INVENTION

However, the CNT-based pellicle membrane does not have durability against a pellicle use environment (low-pressure hydrogen atmosphere). When the pellicle membrane is coated with metal to provide durability, the EUV transmittance decreases, making it impossible to achieve a practical level of transmittance. Therefore, there is a demand for an EUV transmissive membrane having high EUV transmittance at a practical level as well as durability in a low-pressure hydrogen atmospheric environment.

The inventors have recently found that it is possible to provide an EUV transmissive membrane having both high EUV transmittance at a practical level and durability in a low-pressure hydrogen atmospheric environment by combining a main layer composed of metallic beryllium and a protective layer composed of beryllium nitride.

Accordingly, an object of the present invention is to provide an EUV transmissive membrane having both high EUV transmittance at a practical level and durability in a low-pressure hydrogen atmospheric environment.

According to the present invention, there is provided an EUV transmissive membrane comprising:
  a main layer composed of metallic beryllium; and
  a protective layer composed of beryllium nitride that covers at least one side of the main layer.

DETAILED DESCRIPTION OF THE INVENTION

EUV Transmissive Membrane

Figure 1:
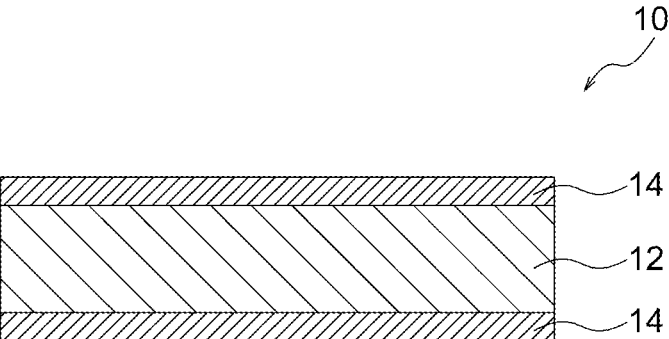
FIG. 1 is a schematic cross-sectional view illustrating an embodiment of an EUV transmissive membrane according to the present invention.

FIG. 1 illustrates a schematic cross-sectional view of an EUV transmissive membrane according to an embodiment of the present invention. The EUV transmissive membrane 10 includes a main layer 12 and a protective layer 14 that covers at least one side of the main layer 12. The main layer 12 is composed of metallic beryllium, while the protective layer 14 is composed of beryllium nitride. Thus, it is possible to provide the EUV transmissive membrane 10 having both high EUV transmittance (e.g., 91% or more) at a practical level and durability in a low-pressure hydrogen atmospheric environment by combining the main layer 12 composed of metallic beryllium and the protective layer 14 composed of beryllium nitride.

In other words, as mentioned above, the poly-Si based pellicle membrane as disclosed in Patent Literature 1 is not practical yet because the EUV transmittance cannot reach the target value of 90% in a case where the thickness is set to maintain the membrane strength. On the other hand, the CNT-based pellicle membrane as disclosed in Patent Literature 2 does not have durability against a pellicle use environment (low-pressure hydrogen atmosphere). When the pellicle membrane is coated with metal to provide durability, the EUV transmittance decreases, making it impossible to achieve a practical level of transmittance. All these problems are successfully solved by the EUV transmissive membrane 10 of the present invention, which may be described as follows. First, the main layer 12 is composed of metallic beryllium. Beryllium has higher EUV transmittance than Si and C, thus exhibiting high EUV transmittance (e.g., 91% or more) at a practical level. Beryllium, on the other hand, is a highly reactive substance, thus reacting with other materials during pellicle membrane fabrication or oxidizing after pellicle membrane fabrication to generate beryllium oxide. Consequently, the EUV transmittance decreases. Therefore, it is possible to prevent the reaction of beryllium in the main layer 12 with the protective layer 14 provided on the main layer 12. Patent Literature 1 discloses that a Ru layer is formed as a protective layer. Although Ru has high EUV transmittance, the EUV transmittance is reduced to 90% only by Ru whose thickness is set to 3 nm, thereby reducing the processing capability of the EUV exposure process. In this respect, the protective layer 14 used in the present invention is composed of beryllium nitride, thereby bringing durability in a low-pressure hydrogen atmospheric environment to the main layer 12 and exhibiting higher EUV transmittance than the Ru layer. As a result, it is possible to provide the EUV transmissive membrane 10 having both high EUV transmittance (e.g., 91% or more) at a practical level and durability in a low-pressure hydrogen atmospheric environment by combining the main layer 12 and the protective layer 14.

The main layer 12 is composed of metallic beryllium. However, the main layer 12 does not need to be completely composed of metallic beryllium. Preferably 99% by weight or more, more preferably 99.5% by weight or more, and even more preferably 99.8% by weight or more of the main layer 12 may be composed of metallic beryllium, which contributes to the realization of high EUV transmittance at a practical level while ensuring basic functions as a pellicle membrane (such as particle adhesion preventing function). From this viewpoint, the thickness of the main layer 12 is preferably 10 to 70 nm, more preferably 15 to 50 nm, and even more preferably 20 to 35 nm.

The protective layer 14 is a layer for protecting the main layer 12, a metallic beryllium layer. Accordingly, the protective layer 14 may cover at least one side of the main layer 12, and it is preferable to cover both sides of the main layer 12 with the protective layer. The protective layer 14 is composed of beryllium nitride. However, the protective layer 14 does not need to be completely composed of beryllium nitride as long as 99% by weight or more, preferably 99.5% by weight or more, and even more preferably 99.8% by weight or more of the protective layer 14 may be composed of beryllium nitride. Since beryllium nitride has high EUV transmittance, the EUV transmittance is higher than that of a beryllium membrane with a Ru layer formed when compared at the same thickness. According to the theoretical calculation, the transmittance is 85.8% in a case where a Ru membrane having a thickness of 3 nm is formed on both sides of a beryllium membrane having a thickness of 30 nm, while the transmittance is 91.1% in a case where beryllium nitride having a thickness of 3 nm is formed on both sides of the beryllium membrane having a thickness of 30 nm. The transmission exceeds 91.1% in a case where beryllium nitride having a thickness of 2 nm and a gradient composition layer (a layer composed of a nitrogen concentration gradient region described later) having a thickness of 1 nm are formed on both sides of the beryllium membrane having a thickness of 30 nm. It is possible to suppress a reaction with $XeF_2$ gas used for etching a Si substrate described later by forming a dense beryllium nitride layer on both sides of the beryllium layer. In addition, beryllium is a very reactive material, thus easily oxidizing to form beryllium oxide, but oxidation can be suppressed by the formation of beryllium nitride. As described above, advantages of using the beryllium nitride layer as the protective layer 14 are an increase in EUV transmittance, protection of the beryllium membrane (main layer 12) in the etching process, and prevention of oxidation.

The protective layer 14 preferably has a thickness of 5 nm or less, and more preferably 3 nm or less. The beryllium nitride membrane having a thickness of 3 nm has an EUV transmittance of 95%, which is much higher than 90% of the Ru membrane. The lower limit of the thickness of the protective layer 14 is not particularly limited but is typically 1 nm or more. The term "beryllium nitride" as used herein means a comprehensive composition that allows not only a stoichiometric composition such as $Be_3N_2$ but also a non-stoichiometric composition such as $Be_3N_{2-x}$, wherein $0<x<2$.

The protective layer 14 preferably has a nitrogen concentration gradient region where nitrogen concentration decreases as closer to the main layer 12. In other words, when the composition of beryllium nitride constituting the protective layer 14 may include from the stoichiometric composition such as $Be_3N_2$ to the non-stoichiometric composition such as $Be_3N_{2-x}$, wherein $0<x<2$, as described above, the beryllium nitride constituting the protective layer 14 preferably has a gradient composition that is richer in beryllium as closer to the main layer 12. As a result, it is possible to improve the adhesion between the protective layer 14 (i.e., beryllium nitride layer) and the main layer 12 (i.e., metallic beryllium layer) and relieve stress caused by the difference in thermal expansion between the two layers. That is, it is possible to improve the adhesion between the two layers to suppress delamination, and to make delamination difficult as a thermal expansion relaxation layer between the two layers in the case of absorbing EUV light and becoming a high temperature. The thickness of the nitrogen concentration gradient region is preferably smaller than that of the protective layer 14. In other words, the entire thickness of the protective layer 14 does not need to be in the nitrogen concentration gradient region. For example, it is preferable that only a part of the thickness of the protective layer 14, for example, a region of preferably 10 to 70% and more preferably 15 to 50% of the thickness of the protective layer 14 is the nitrogen concentration gradient region.

In the EUV transmissive membrane 10, the main region for transmitting EUV is preferably in a form of the free-standing membrane. In other words, it is preferable that the substrate (e.g., Si substrate) used at the time of deposition remains as a border only at the outer edge of the EUV transmissive membrane 10, that is, no substrate (e.g., Si substrate) remains in the main region other than the outer edge. In shoer, the main region preferably consists of the main layer 12 and the protective layer 14.

The EUV transmissive membrane 10 may have high EUV transmittance at a practical level, and preferably has an EUV transmittance of 91% or more, more preferably 92% or more, and even more preferably 93% or more. Since a higher EUV transmittance is desirable, the upper limit is not particularly limited, but the EUV transmissive membrane 10 can typically have a EUV transmittance of 99% or less, more typically 98% or less, and even more typically 95% or less.

Manufacturing Method

After a laminated membrane to be an EUV transmissive membrane is formed on a Si substrate, the EUV transmissive membrane according to the present invention can be fabricated by removing an unnecessary portion of the Si substrate through etching to form a free-standing membrane. Accordingly, the main portion of the EUV transmissive membrane is in the form of the free-standing membrane in which no Si substrate remains as described above.

(1) Preparation of Si Substrate

First, a Si substrate for forming a laminated membrane thereon is prepared. After the laminated membrane composed of the main layer 12 and the protective layer 14 is formed on the Si substrate, the main region (i.e., a region to be a free-standing membrane) other than the outer edge of the Si substrate is removed by etching. Accordingly, it is desirable to reduce the thickness of the Si substrate in the region to be formed into the free-standing membrane in advance in order to perform the etching efficiently in a short time. Therefore, it is desirable that a mask corresponding to the EUV transmission shape is formed on the Si substrate by employing a normal semiconductor process, and the Si substrate is etched by wet etching to reduce the thickness of the main region of the Si substrate to a predetermined thickness. The wet-etched Si substrate is cleaned and dried to prepare a Si substrate having a cavity formed by wet etching. The wet etching mask may be made of any material that is corrosion resistance to Si wet etchant, for example, $SiO_2$ is suitable for use. In addition, the wet etchant is not particularly limited as long as it is capable of etching Si. For example, TMAH (tetramethylammonium hydroxide) is preferred because it can be used under appropriate conditions, and very good anisotropic etching can be performed on Si.

(2) Formation of Laminated Membrane

The laminated membrane may be formed by any deposition method. An example of the preferred deposition method is the sputtering method. In the case of fabricating a three-layer structure of beryllium nitride/beryllium/beryllium nitride, it is preferable that the beryllium membrane as the main layer 12 is fabricated by sputtering using a pure Be target and the beryllium nitride membrane as the protective layer 14 is done by reactive sputtering. The reactive sputtering can be performed, for example, by adding nitrogen gas to the chamber during sputtering using a pure Be target, whereby beryllium and nitrogen react to each other to generate beryllium nitride. As another method, beryllium nitride can be produced by forming a beryllium membrane and then irradiating the membrane with nitrogen plasma to cause a nitriding reaction of beryllium, thereby generating beryllium nitride. In any case, synthetic methods for beryllium nitride are not limited thereto. Although it is preferable to use different beryllium targets for forming the beryllium nitride membrane and the beryllium membrane, it is also possible to use the same target for forming the beryllium nitride membrane and the beryllium membrane. The beryllium nitride and beryllium membranes may be formed in a one-chamber sputtering apparatus as in Examples described later, or a two-chamber sputtering apparatus may be used to form the beryllium nitride and beryllium membranes in separate chambers.

In the case of forming a nitrogen concentration gradient region, when depositing metallic beryllium from the beryllium nitride membrane, the introduction of nitrogen gas may be stopped and switched to metallic beryllium deposition while continuing a sputtering. In this way, a region is formed in which the nitrogen concentration in the film-deposited membrane decreases in the thickness direction as the concentration of nitrogen gas decreases. On the other hand, in the case of switching the metallic beryllium to the beryllium nitride, the nitrogen concentration gradient region can be formed by starting the introduction of nitrogen gas in the middle of the process while sputtering is performed, contrary to the above. The thickness of the nitrogen concentration gradient region can be controlled by adjusting the time for which the nitrogen gas concentration is changed.

(3) Free-standing Membrane Formation

An unnecessary portion of the Si substrate other than the outer edge of the Si substrate where the composite membrane is formed, which is left as a border, is removed by etching to make the composite membrane free-standing. Etching of Si may be performed by any method, but etching with $XeF_2$ is preferred.

EXAMPLES

The present invention will be described in more detail with reference to the following examples.

Example 1

According to the procedures illustrated in FIGS. 2A and 2B, a composite free-standing membrane (EUV transmissive membrane) with a three-layer structure of beryllium nitride/beryllium/beryllium nitride was fabricated as follows.

(1) Preparation of Si Substrate

Figure 2A:
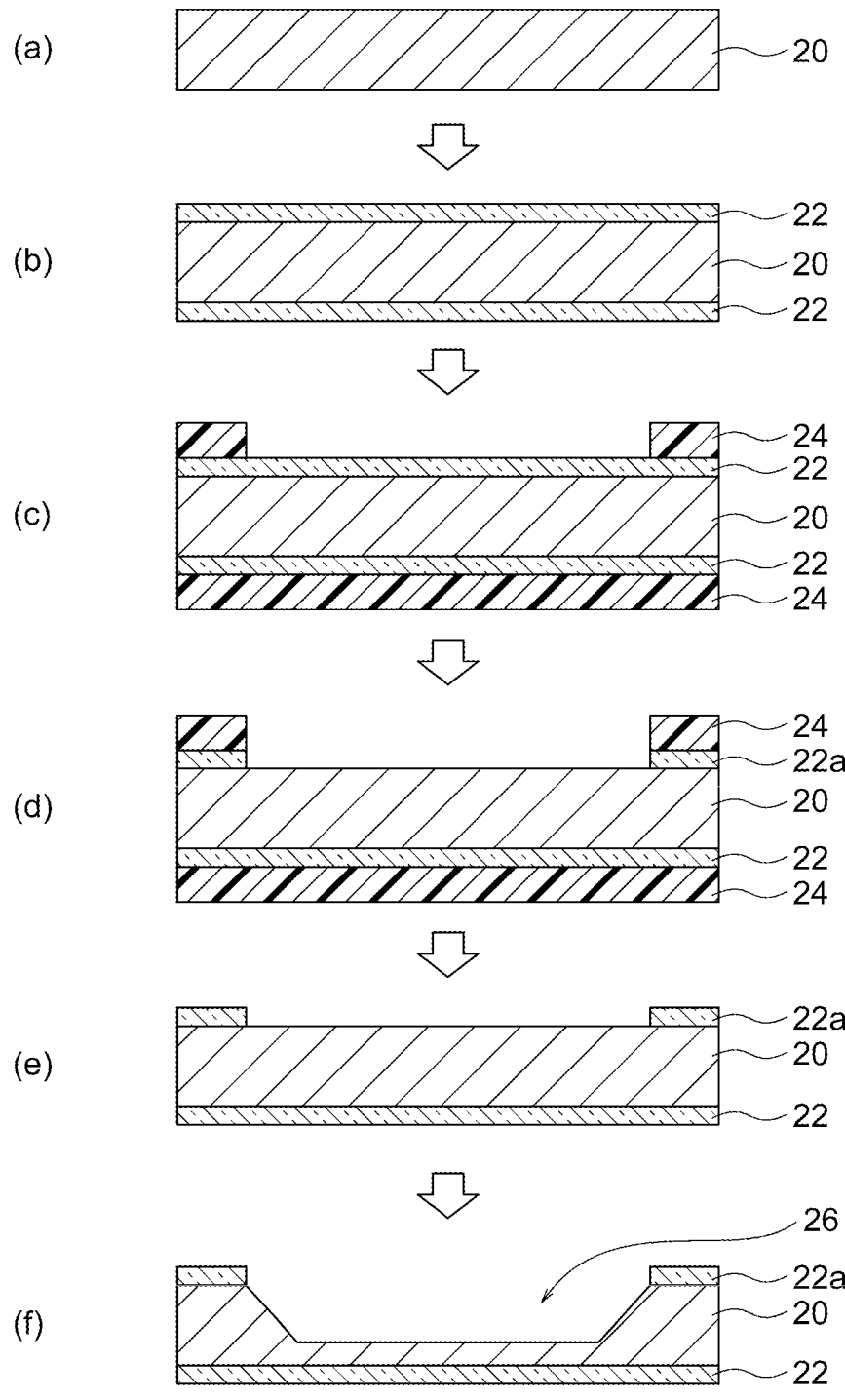
FIG. 2A is a process flow diagram illustrating the first half of a manufacturing procedure for an EUV transmissive membrane in Examples 1 to 3.
Figure 2B:
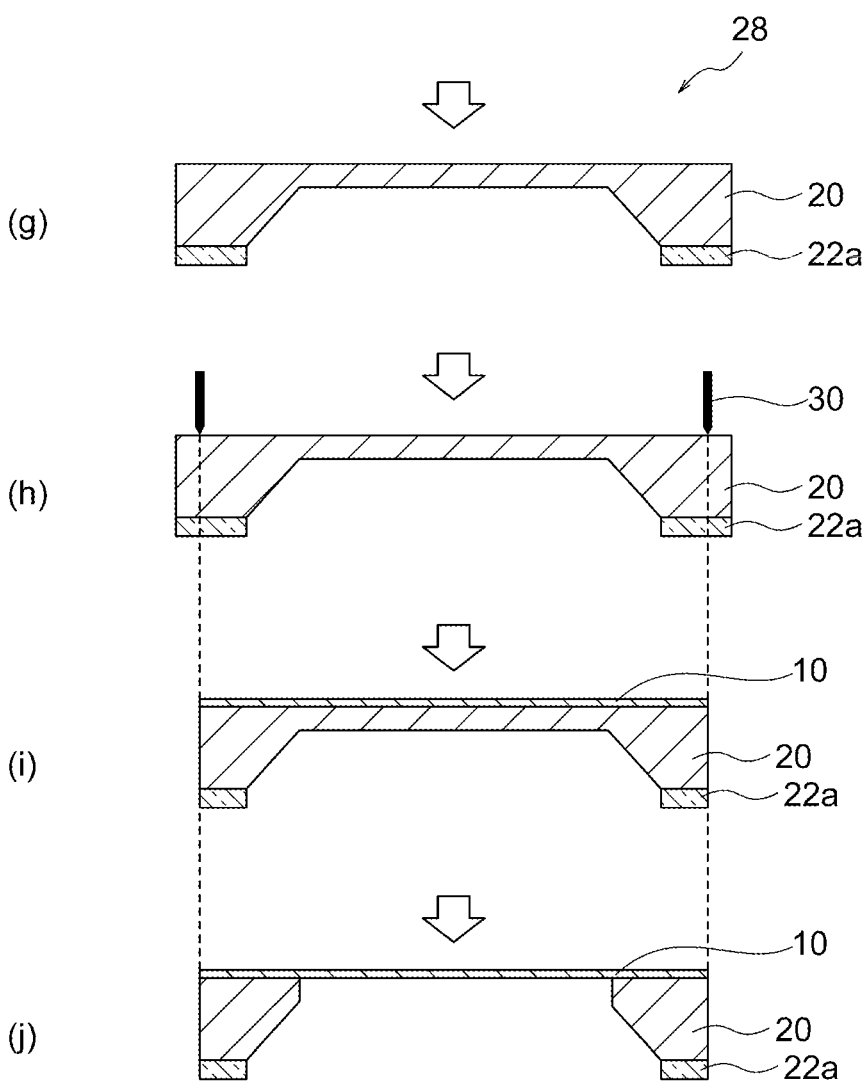
FIG. 2B is a process flow diagram illustrating the second half of a manufacturing procedure for an EUV transmissive membrane in Examples 1 to 3.

A Si wafer 20 having a diameter of 8 inches (20.32 cm) was prepared (FIG. 2A (a)). A $SiO_2$ membrane 22 having a thickness of 50 nm was formed on both sides of the Si wafer 20 by thermal oxidation (FIG. 2A (b)). Resist was applied to both sides of the Si wafer 20, and a resist mask 24 for $SiO_2$ etching was formed by exposure and development so that a 110 mm×145 mm resist hole was created on one side (FIG. 2A(c)). An exposed portion of the $SiO_2$ membrane 22 was etched and removed by wet-etching one side of the substrate with hydrofluoric acid to fabricate a $SiO_2$ mask 22a (FIG. 2A(d)). The resist mask 24 for $SiO_2$ etching was removed with an ashing apparatus (FIG. 2A(e)). Si was then etched with a TMAH solution. This etching was performed only for an etching time to obtain a target Si substrate having thickness of 50 μm with an etching rate measured in advance (FIG. 2A(f)). Finally, the $SiO_2$ membrane 22 formed on the surface not subjected to Si etching was removed and cleaned with hydrofluoric acid to prepare a Si substrate 28 (FIG. 2B(g)). The Si substrate outline may be diced with a laser 30, if necessary (FIG. 2B (h)), to achieve the desired shape (FIG. 2B (i)). In this way, a 110 mm×145 mm cavity 26 was provided at the center of the 8-inch (20.32 cm) Si wafer 20 to prepare the Si substrate 28 having a Si thickness of 50 μm in the cavity 26 portion.

(2) Formation of Composite Membrane

On the Si substrate 28 including the cavity 26 obtained in (1) above, a composite membrane with a three-layer structure of beryllium nitride/beryllium/beryllium nitride was formed as follows (FIG. 2B(i)). First, the Si substrate 28 was set in a sputtering apparatus, and a pure Be target was attached thereto. A chamber was evacuated, the flow ratio of argon gas and nitrogen gas was adjusted to 1:1 to carry out reactive sputtering at an internal pressure of 0.5 Pa, and the reactive sputtering was terminated at the time when 2 nm of beryllium nitride was layer-deposited. Subsequently, sputtering was performed only with argon gas without introducing nitrogen gas, and the sputtering was terminated at the time when 25 nm of beryllium was layer-deposited. Thereafter, reactive sputtering was performed while introducing nitrogen gas again in the same manner as in the first step, and the reactive sputtering was terminated at the time when 2 nm of beryllium nitride was layer-deposited. In this manner, a composite membrane with 2 nm of beryllium nitride/25 nm of beryllium/2 nm of beryllium nitride was formed as the EUV transmissive membrane 10.

(3) Free-standing Membrane Formation

The Si substrate 28 with the composite membrane prepared in (2) above was set in a chamber of an $XeF_2$ etcher capable of processing an 8-inch (20.32 cm) substrate. The chamber was sufficiently evacuated. At this time, if moisture remains in the chamber, the moisture reacts with the $XeF_2$ gas to generate hydrofluoric acid, and corrosion of the etcher or unexpected etching occurs. Therefore, the sufficient evacuation was performed. If necessary, vacuuming and nitrogen gas introduction were repeated in the chamber to reduce residual moisture in the chamber. When the sufficient evacuation was achieved, a valve between a $XeF_2$ material tank and a preliminary space was opened. As a result, $XeF_2$ was sublimated, and $XeF_2$ gas was also accumulated in the preliminary space. When the $XeF_2$ gas was sufficiently accumulated in the preliminary space, the valve between the preliminary space and the chamber was opened to introduce the $XeF_2$ gas into the chamber. The $XeF_2$ gas was decomposed into Xe and F, and F reacted with Si to generate $SiF_4$. Since the boiling point of $SiF_4$ was –95° C., $SiF_4$ generated was rapidly evaporated, causing a reaction of F with the newly exposed Si substrate. When the Si etching proceeded and F in the chamber decreased, the chamber was evacuated, and the $XeF_2$ gas was introduced into the chamber again to perform the etching. In this manner, the evacuation, the introduction of the $XeF_2$ gas, and the etching were repeated, and the etching was continued until the Si substrate 28 corresponding to the portion to be formed into the free-standing membrane disappeared. When the Si substrate of the unnecessary portion disappeared, the etching was terminated. In this way, a composite free-standing membrane having a border made of Si is obtained as the EUV transmissive membrane 10 (FIG. 2(*j*)).

Example 2

A composite free-standing membrane was fabricated in the same manner as in Example 1, except that the composite membrane was formed as follows.

(Formation of Composite Membrane)

The cavity-formed Si substrate obtained in (1) of Example 1 was placed in a sputtering apparatus to deposit beryllium to a thickness of 1 nm. Then, plasma was generated while nitrogen gas was introduced into the chamber, and the generated nitrogen plasma was reacted with the film-deposited beryllium to form beryllium nitride. Subsequently, beryllium was film-deposited on the formed beryllium nitride membrane to a thickness of 26 nm. After deposition, plasma was generated while nitrogen gas was introduced into the chamber again to form beryllium nitride on the surface. In this way, a beryllium membrane having a thickness of 25 nm with a beryllium nitride membrane having a thickness of 1.5 nm on both sides (a composite membrane with 1.5 nm of beryllium nitride/25 nm of beryllium/1.5 nm of beryllium nitride) was formed.

Example 3 (Comparison)

An EUV transmissive membrane (free-standing beryllium monolayer membrane) was fabricated in the same manner as in Example 1, except that the beryllium nitride membrane was not formed (i.e., a monolayer with 25 nm of beryllium was formed instead of the composite membrane with 2 nm of beryllium nitride/25 nm of beryllium/2 nm of beryllium nitride).

EUV Transmittance

EUV light was irradiated onto the EUV transmissive membrane fabricated in Examples 1 to 3 to measure the amount of transmitted EUV light with a sensor. The EUV transmittance was determined by comparing the obtained measurement value with a value obtained by directly measuring the amount of EUV light with a sensor without using the EUV transmissive membrane. As a result, the EUV transmittance of the composite free-standing membrane fabricated in Example 1 was 93.0%, which was almost equal to a theoretically calculated value of 93.3%. In addition, the EUV transmittance of the composite free-standing membrane fabricated in Example 2 was 93.5%, which was a value close to the theoretically calculated value of 94.1%. It is presumed that these differences between the measured value and the theoretical value are due to errors in membrane thickness. On the other hand, when the EUV transmittance of the free-standing beryllium monolayer membrane of Example 3 as a comparative example was measured to be 90.2%. When the free-standing monolayer membrane was analyzed, beryllium fluoride which was considered to be formed during $XeF_2$ etching was confirmed on both surfaces of the membrane. It is considered that the EUV transmittance decreased due to the beryllium fluoride.

What is claimed is:

1. An EUV transmissive membrane comprising:
   a main layer composed of metallic beryllium having a thickness of 10 to 70 nm; and
   a protective layer composed of beryllium nitride that covers at least one side of the main layer having a thickness of 5 nm or less.

2. The EUV transmissive membrane according to claim 1, wherein both sides of the main layer are covered with the protective layer.

3. The EUV transmissive membrane according to claim 1, wherein the protective layer has a thickness of 1 nm to 5 nm.

4. The EUV transmissive membrane according to claim 1, wherein the protective layer has a thickness of 3 nm or less.

5. The EUV transmissive membrane according to claim 1, wherein the protective layer has a nitrogen concentration gradient region where nitrogen concentration decreases towards the main layer.

6. The EUV transmissive membrane according to claim 5, wherein the thickness of the nitrogen concentration gradient region is smaller than that of the protective layer.

7. The EUV transmissive membrane according to claim 1, wherein the main layer has a thickness of 15 to 50 nm.

\* \* \* \* \*